United States Patent [19]

Mortensen et al.

[11] Patent Number: 4,709,834

[45] Date of Patent: Dec. 1, 1987

[54] STORAGE BOX

[75] Inventors: Roger Mortensen; Barry Gregerson, both of Excelsior, Minn.

[73] Assignee: Empak Inc., Chanhassen, Minn.

[21] Appl. No.: 9,899

[22] Filed: Feb. 2, 1987

[51] Int. Cl.⁴ .............................................. B65D 45/16
[52] U.S. Cl. ..................................... 220/326; 220/324
[58] Field of Search ........................ 220/324, 326, 306

[56] References Cited

U.S. PATENT DOCUMENTS 3,841,518 10/1974 Hines .................................... 220/326
3,843,013 10/1974 Brooks, Jr. ........................... 220/326
4,582,219 4/1986 Mortensen et al. .................. 220/326

Primary Examiner—George T. Hall
Attorney, Agent, or Firm—Hugh D. Jaeger

[57] ABSTRACT

Storage box including a box, a box door, a spring biased wafer retainer, and two locking clips. The storage box is used with standard mechanical interface (SMIF) transfer equipment, and is sealable, dust proof, and stackable. The box door includes cross-bar locators for cross-bar wafer cassettes. The box door will also accept other types of wafer processing cassettes. Each of the locking clips engage into a clip enclosure outboard of the box, and includes a locking slot for the locking clip, as well as a latch pin opening which provides for movement of the latch pin. A spring bar including parallel contact bars and configured spring bar ends positions to secure wafers in a contained wafer processing cassette.

4 Claims, 13 Drawing Figures

STORAGE BOX

BACKGROUND OF THE INVENTION

1. Field of the Invention

The present invention pretains to a storage box for wafer cassettes, and more particularly, pertains to a standard mechanical interface (SMIF) storage box, including a box, box door, and locking clips for encompassing a wafer cassette.

2. Description of the Prior Art

The SMIF box, SMIF standing for Standard Mechanical Interface equipment, is an industry-wide uniform interface for transferring a wafer cassette carrying a plurality of silicon wafers between boxes or into and out of processing equipment. The SMIF box provides a clean room environment for the wafers inside the boxes, as well as equipment canopies isolated from an operator's environment. The group which designated the standard specifications for SMIF designed an entirely new system, as well as dictating specifications requiring a new design for the SMIF box, box door, and locking mechanism.

The prior art boxes have not been acceptable to robotic processing equipment, and also have not provided the necessary wafer environment inside the storage boxes. Prior art storage boxes have not been compatible nor oriented for robotic processing equipment, especially state-of-the-art robotic processing equipment for handling of wafer cassettes, including cross-bar wafer cassettes in storage boxes, such as that designed under the SMIF concept.

U.S. Pat. No. 4,582,219, entitled "Storage Box Having Resilient Fastening Means" issued Apr. 15, 1986, assigned to the assignee of this patent is representative of the SMIF box and for the basis of this patent.

Prior art boxes have not fully provided for spring loaded or tensioned securement and cotnainment of wafers in a wafer cassette contained within a SMIF box. Containment methods were of a fixed type calling for much more precise fit of the containment devices against the wafers.

The present invention overcomes the disadvantages of the prior art by providing a wafer retainer spring contained in a storage box designated for use in standard mechanical interface (SMIF) equipment for processing and containment of wafers held in a wafer cassette, the wafer cassette being housed in the SMIF storage box.

SUMMARY OF THE INVENTION

The general purpose of the present invention is a standard mechanical interface (SMIF) storage box, including a box, a box door, a spring biased wafer retainer, and two locking clips. The storage box is compatible to the standard mechanical interface equipment for processing of silicon wafers held in a wafer processing cassette, such as a cross-bar wafer processing cassette, and for use in robotic processing equipment, such as the type which includes a canopy over the equipment and an interface port for accepting the SMIF storage box. The SMIF storage box provides a clean room space within the SMIF storage box, thereby isolating the wafers from contaminates in the outside environment.

According to one embodiment of the present invention, there is provided a SMIF storage box, including a box, a box door, a spring biased wafer retainer, two locking clips which engage into outboard clip enclosures, and locking slots in each of the outboard clip enclosures. The locking clips each each include spring latches which engage into lock interfaces of the door. The spring latch of the locking clip is provided with a latch pin engagement area for robotic unlatching of the spring latch for releasing of the door. The door includes a plurality of locator flanges for acceptance of cross-bar cassettes, metal cassettes, and other cassettes. Tabs also extend upwardly to prevent misorientation of a cassette with respect to the door. A spring biased wafer retainer includes parallel spring mounted wafer contact bars which provide spring mounted securement contact against wafers in a wafer cassette upon securement of a box door within the box.

One significant aspect and feature of the present invention is a SMIF storage box which is sealable, dust proof and stackable. The storage box which includes handle provisions for ease of operator handling or ease of robotic gripper handling.

A further significant aspect and feature of the present invention is a SMIF storage box which is compatible with standard specifications for standard mechanical interface transfer equipment. Specifically, the box can be used in equipment, including a canopy, elevator, interface port, and manipulator.

Another significant aspect and feature of the present invention is a SMIF storage box with a spring biased wafer retainer including spring tensioned wafer contact bars for securement of wafers in a contained wafer cassette.

Yet another significant aspect and feature of the present invention is a SMIF storage box including a spring biased wafer retainer which is activated upon engagement of a box door within a box.

Still aother significant aspect and feature of the present invention is a spring biased wafer retainer including a wedge shaped lower spring containment member and attached controlled movement link member.

Having thus described embodiments of the present invention, it is the principal object hereof to provide a storage box which is compatible with standard specifications for standard mechanical interface (SMIF) transfer equipment. The storage box includes a box, a box door, a spring biased wafer retainer, and two locking clips.

One object of the present invention is a SMIF box that is designed for robotic handling equipment. Particularly, the box provides for being handled by a robotic gripper and for storing a wafer processing cassette including a plurality of round silicon wafers.

Another object of the present invention is a SMIF box including a spring biased wafer retainer and method of securement to the SMIF box.

BRIEF DESCRITPION OF THE DRAWINGS

DESCRIPTION OF THE PREFERRED EMBODIMENTS

Figure 1:
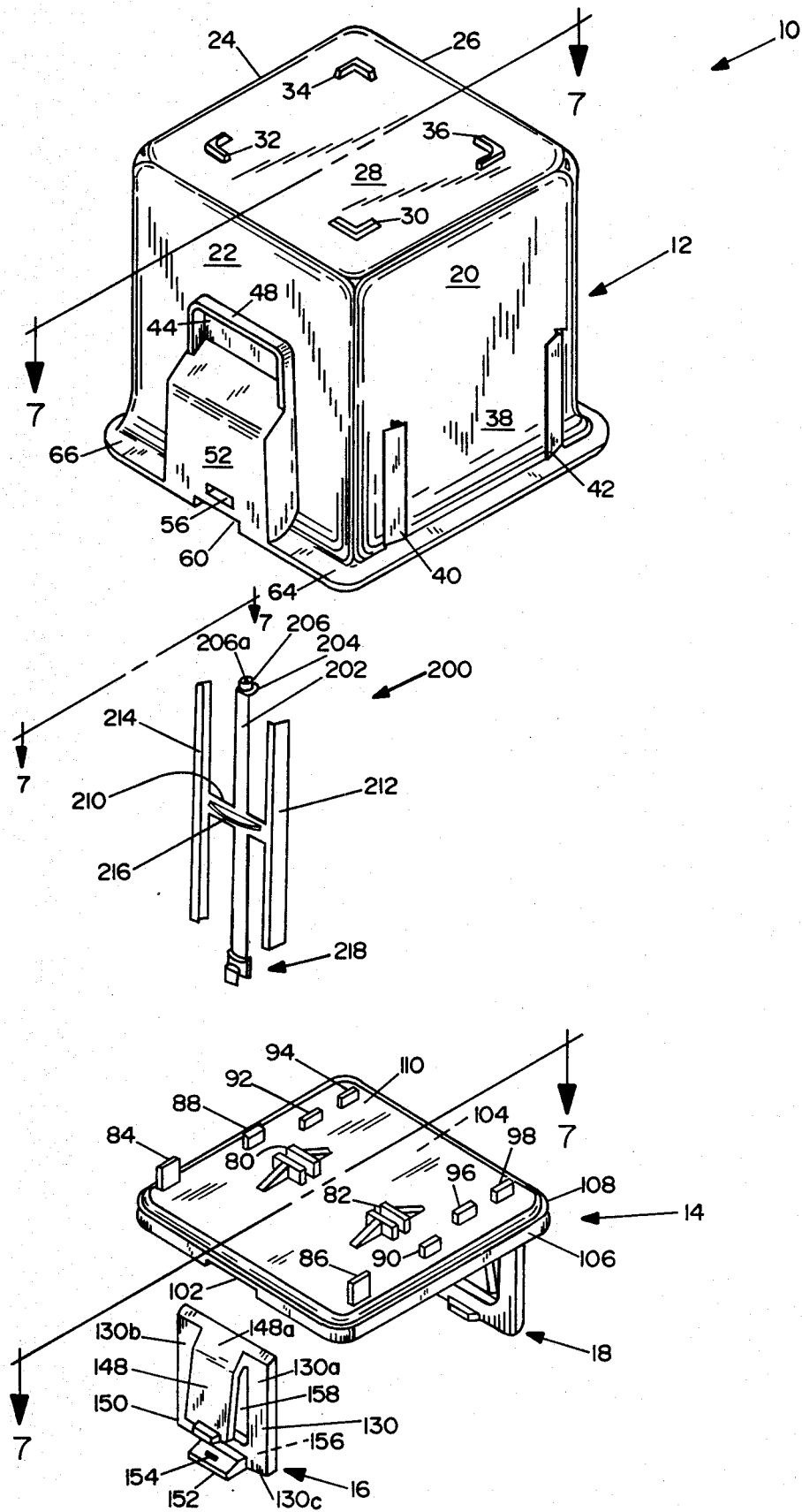
FIG. 1 illustrates a perspective view of components for a storage box, including a box, a door, two locking clips, and a spring biased wafer retainer.
Figure 6:
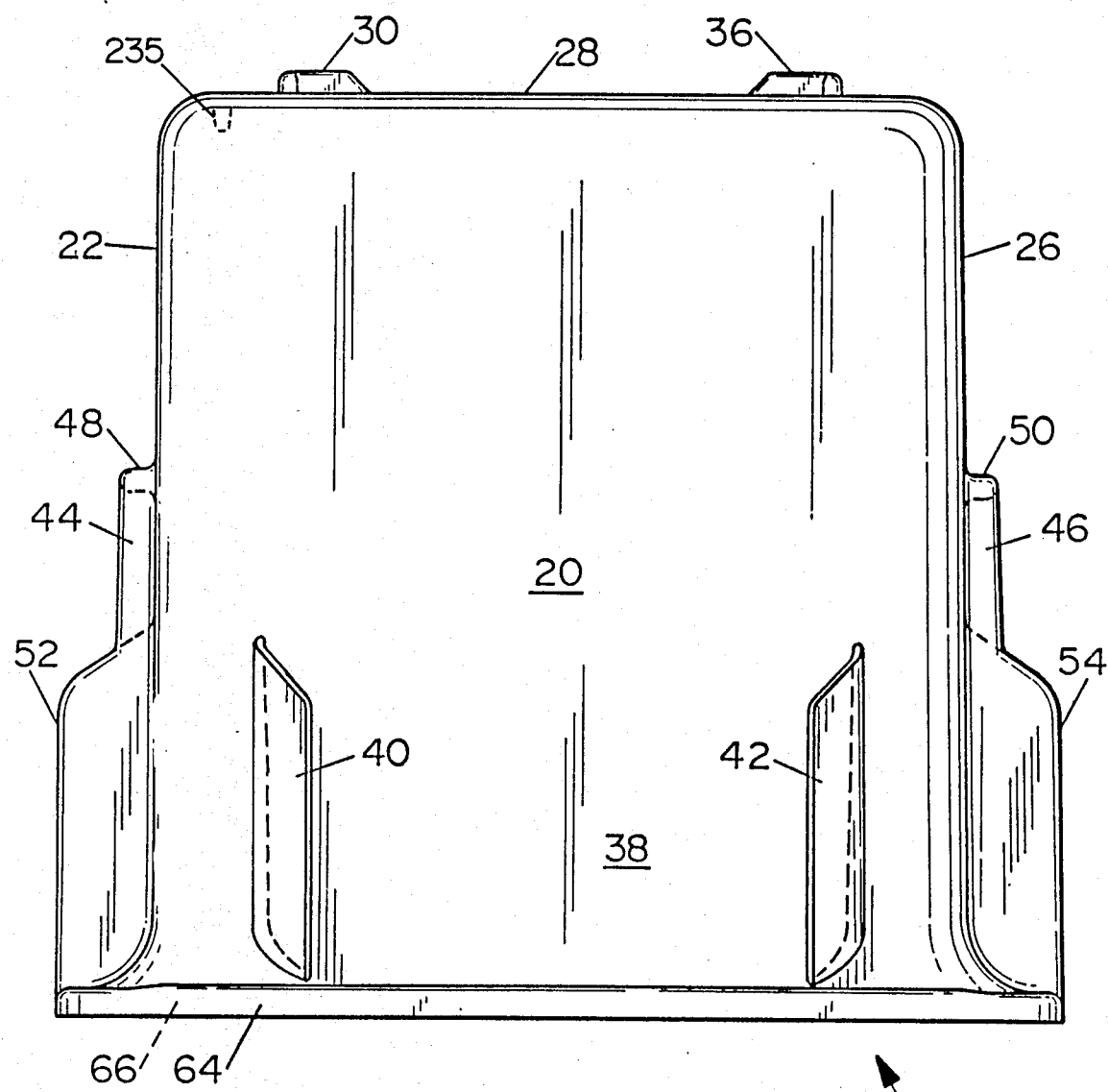
FIG. 6 illustrates a side elevation of the storage box.
Figure 7:
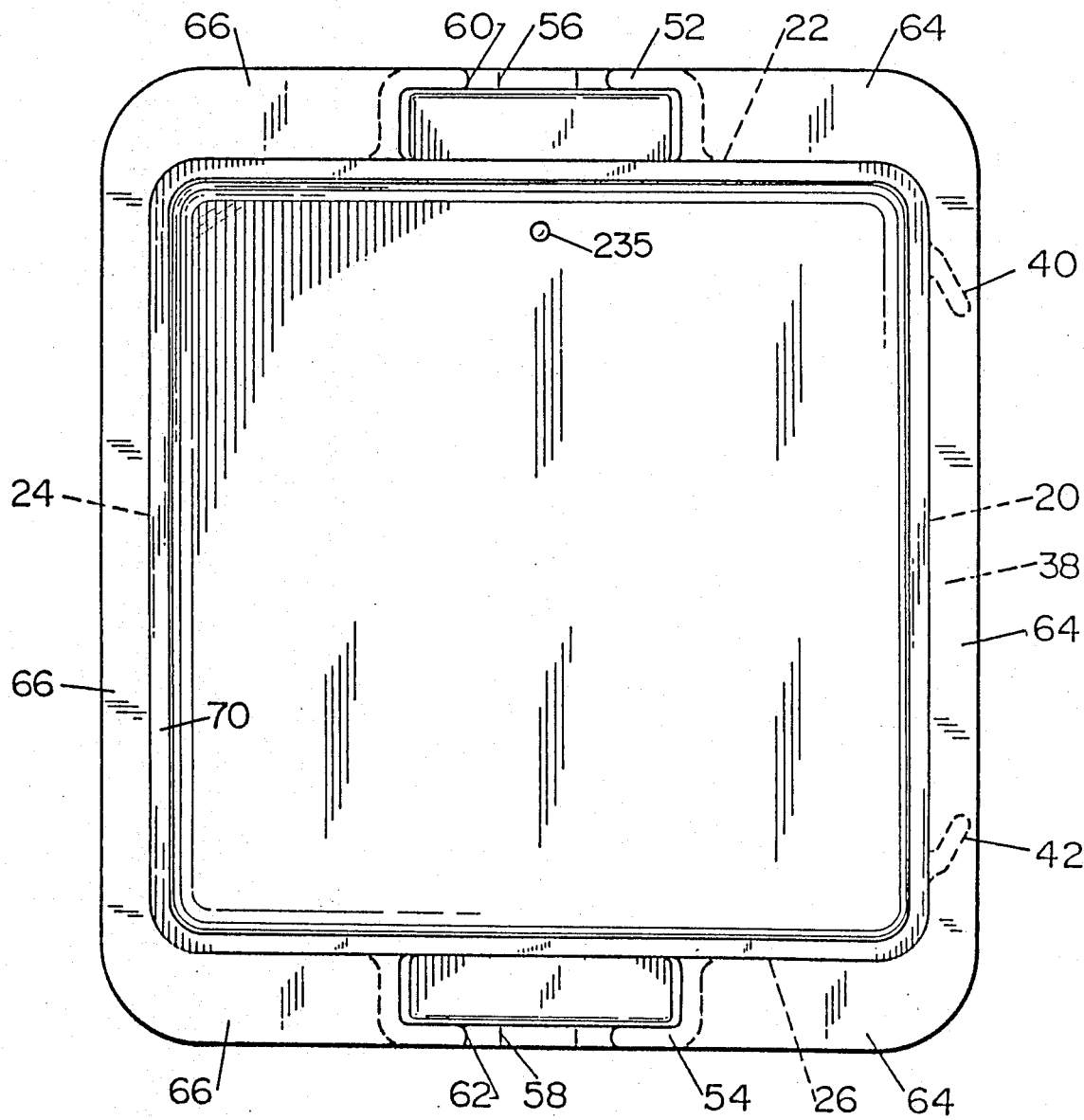
FIG. 7 illustrates a bottom view of the storage box.
Figure 10:
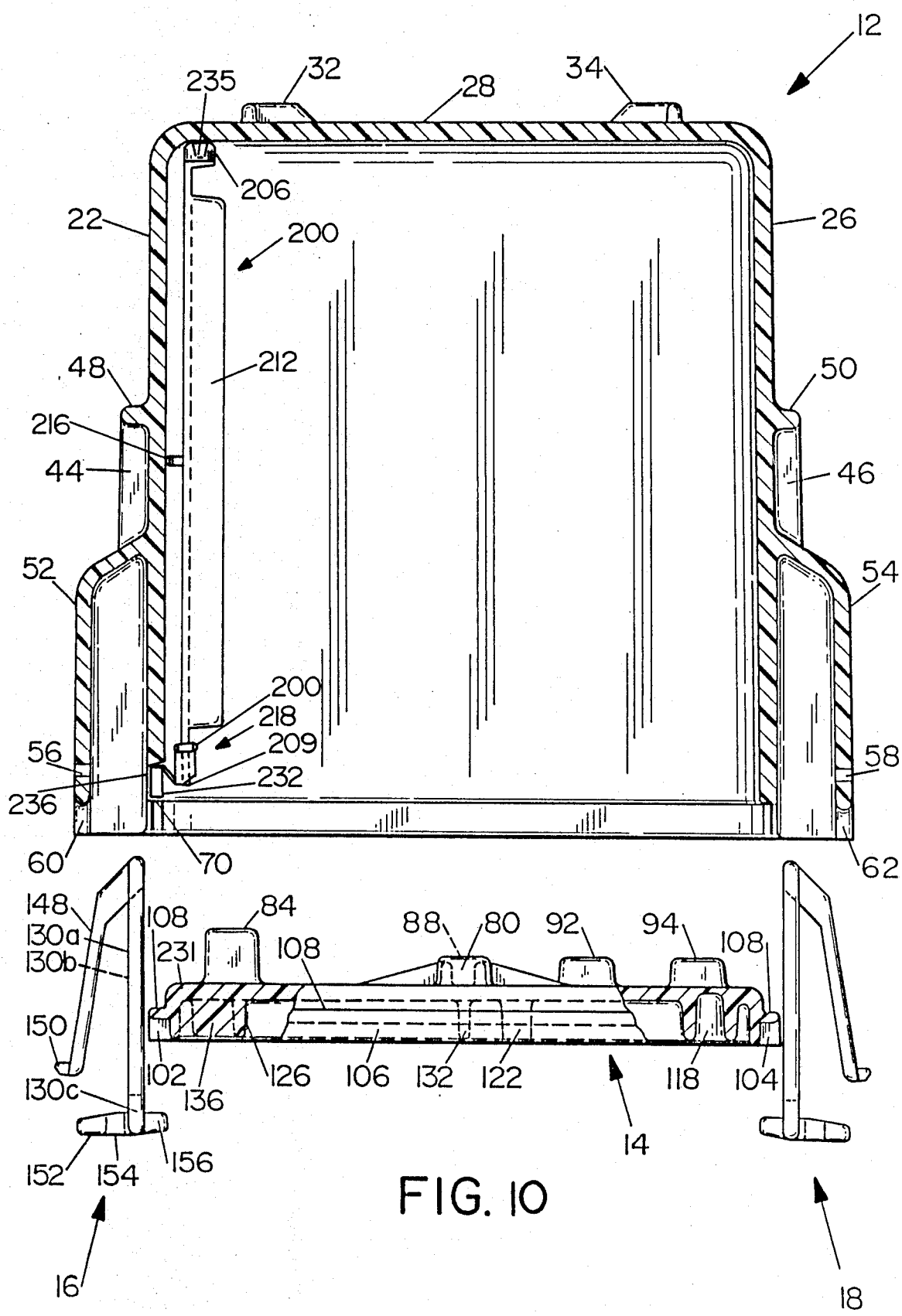
FIG. 10 illustrates a cross-sectional view of the storage box, wafer retainer engaged in the storage box, door, and locking clips along section lines 10—10 of FIG. 1 as they are separated prior to engagement.
Figure 12:
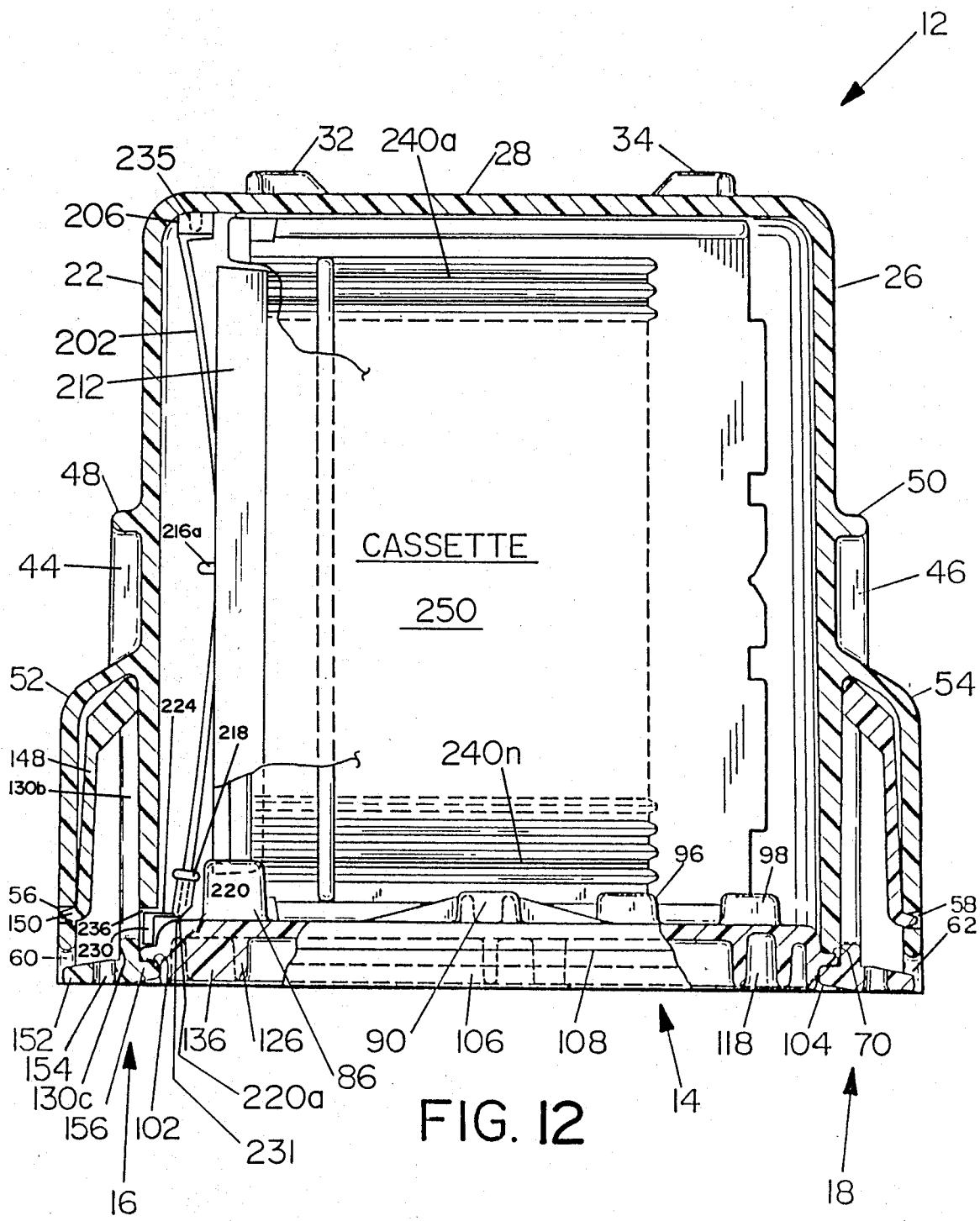
FIG. 12 illustrates a cutaway cross-sectional side view of the assembled box, including the door, locking clips, wafer cassette, and wafer retainer engaged within the storage box.
Figure 13:
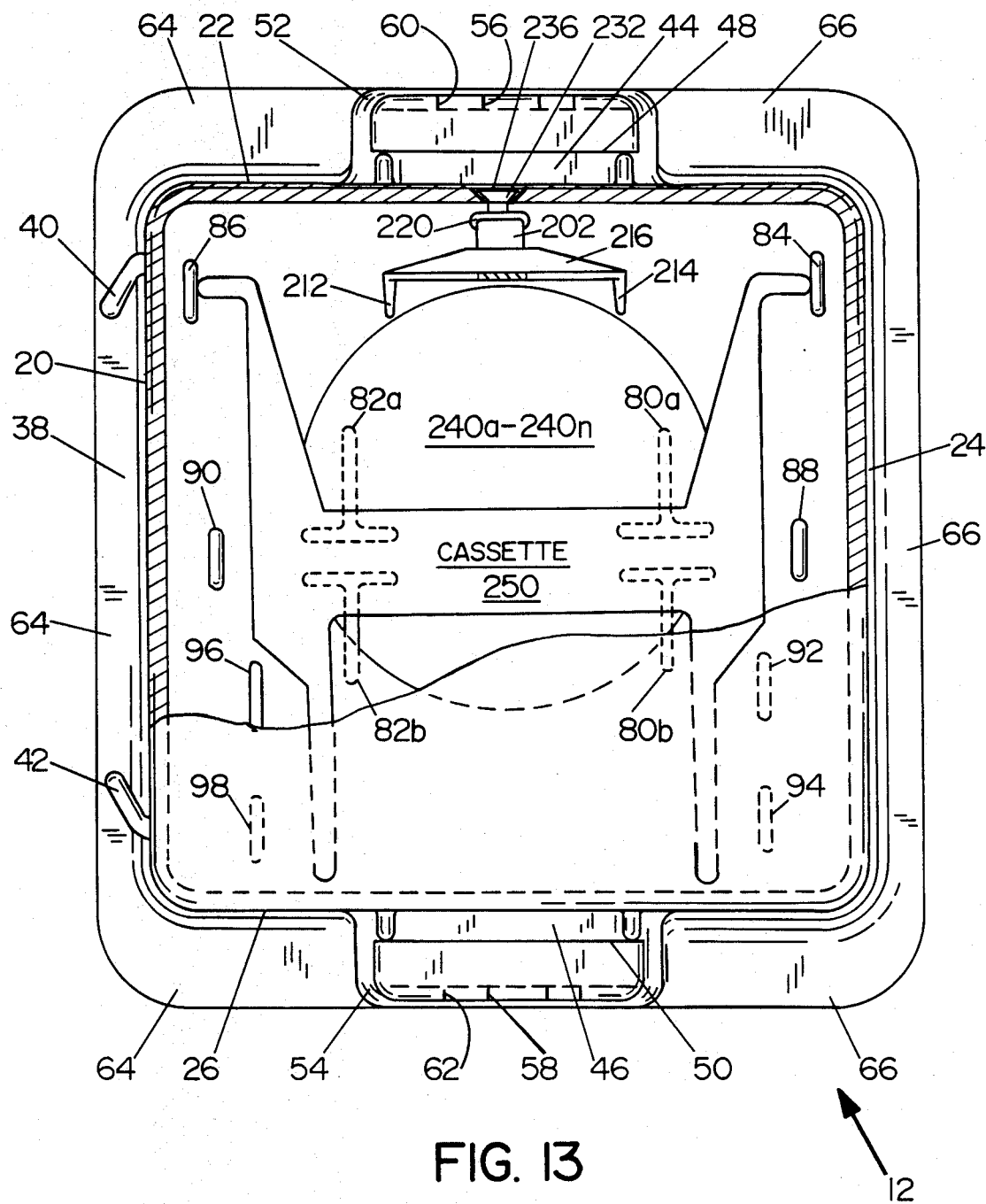
FIG. 13 illustrates a cutaway top view of the storage box including the wafer retainer engaged against wafers in a wafer cassette.

FIG. 1 illustrates a perspective view of a standard mechanical interface (SMIF) storage box including a box 12, a door 14, locking clips 16 and 18, and a wafer retainer 200, where the components 12-18 and 200 are separated from each other for purposes of illustration. The box 12 includes four sides 20, 22, 24, and 26 and a top 28. Four right angle stacking tabs 30, 32, 34 and 36 extend upwardly from the top 28. The stacking tabs are for engaging the bottom side of the door 14, as later described in detail, and also serve as support feet for the box 12. A run card area 38 is provided between run card slot tabs 40 and 42 which extend upwardly and outwardly accordingly. Handle areas 44 and 46 located within outwardly extending handles 48 and 50, as also illustrated in FIG. 6, are provided for manual pick up by an individual's hands or a robotic gripper pick up. Outboard spring clip locking retaining enclosures 52 and 54, as also shown in FIGS. 10 and 12, encompass the locking clip 16 and 18 upon engagement. Each outboard clip enclosure is also provided with locking slots 56 and 58, and latch pin opening 60 and 62, as also illustrated in FIGS. 7, 10, and 12. Perimeter flanges 64 and 66 extend about the lower edge of the box, as also illustrated in FIG. 13.

Figure 9:
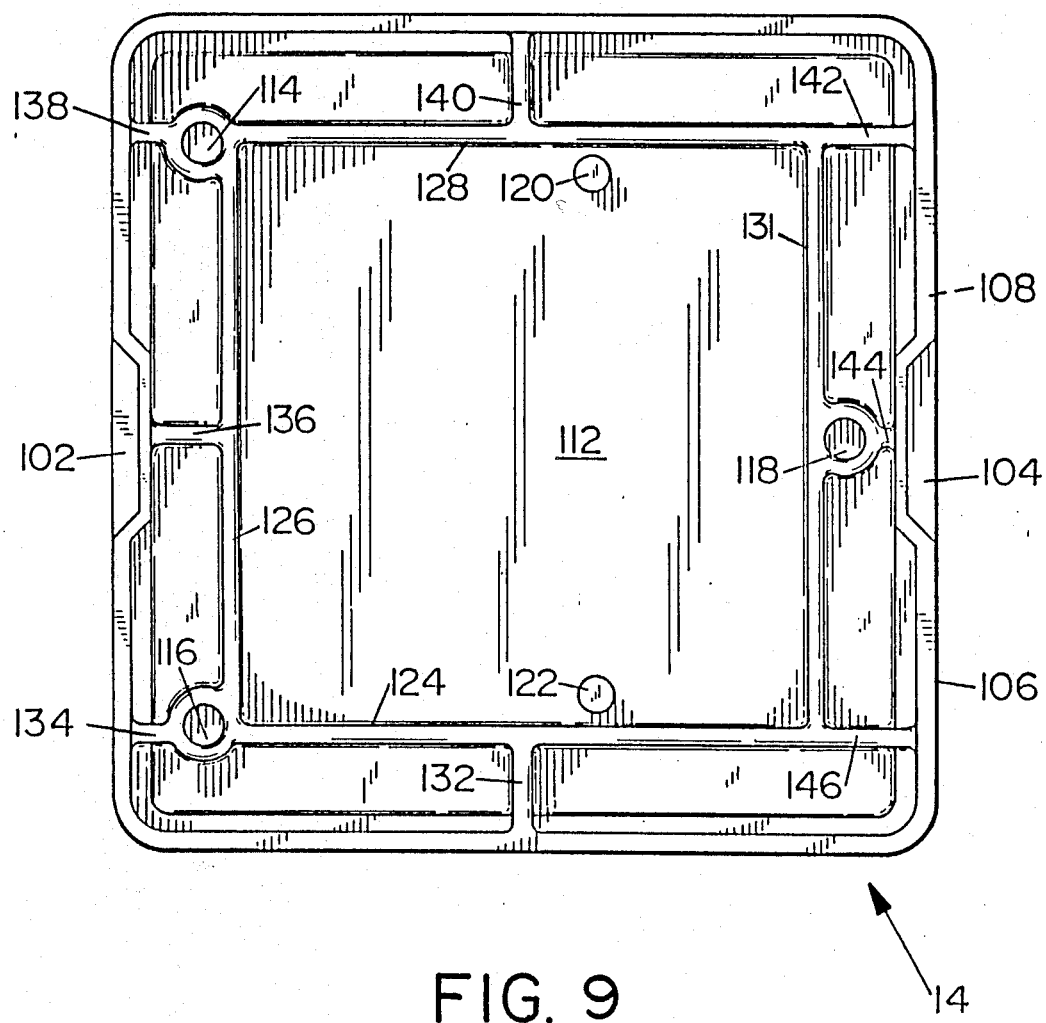
FIG. 9 illustrates a bottom view of the box door.

The door includes two pairs of cross-bar wafer processing cassette locators 80 and 82, two top flange locator pins 84 and 86, two metal wafer processing cassette locator tabs 88 and 90, and four goof proof tabs 92, 94, 96, and 98 so that a cassette cannot be put in backwards. Lock interface grooves 102 and 104, as illustrated in FIG. 9, are provided for the locking clips 16 and 18.

The locking clip 16, which is identical in structure to the locking clip 18, includes a spring arm 148, a lock retainer 150, a latch pin arm 152, a latch pin hole 154, a spring latch 156 where the components 152-156 are affixed to the bottom of a clip surface 130. Spring arm 148 engages the lock retainer 150 into slot 56. Members 130a and 130b also provide spring action for the spring latch 156 acting against spring arm 148. In a rest position, the back side of the flat planar spring surfaces 130a and 130b are in direct surface contact with the side 22 of the box 12 as are the bottom planar spring surface 130c. The spring clips 16 and 18 are geometrically configured providing for inherent spring action during spring movement within the space 158.

The box 12, door 14, and clips 16 and 18 and wafer retainer 200, are made of a suitable polymer or like material. The material can include protective electrostatic properties and ultraviolet filtering as required.

A spring biased wafer retainer 200 includes spring member 202, a right angle flange 204 affixed to the upper end of spring member 202, a capturing cylinder 206 affixed on the upper surface of flange 204, a hole 106a in cylinder 206, and a configured molded collar 208 affixed to the opposite lower end 209 of spring member 202. A cross-member 210 positions perpendicular to the spring bar member 202 in the mid-portion of spring member 202, and joins mirror-imaged, like-opposed, parallel, vertically aligned wafer contact bars 212 and 214. Parallel wafer contact bars 212 and 214 position perpendicularly and vertically with respect to the plane of the cross member 210 and spring member 202. Cross member extensions 210a and 210b position perpendicular to and beneath wafer contact bars 212 and 214. An overcenter cam 216 positions on the back side of cross member 210 to cause proper spring 202 deflection and positioning for containment of wafers by the spring 200 in a cassette contained within the storage box 10. The member of elements 202-216, except 208 and 209, can be of a material such as glass filled polycarbonate, providing the spring retainer movement and action. A flexible coupler 218, also illustrated in FIGS. 4 and 5 positions over the lower end 209 and against collar 208 as illustrated in FIG. 3.

Flexible coupler 218 includes an oval shaped body member 220, oval shaped hole 222 extending vertically through the oval body member 220, a configured link 224 including living hinges 226 and 228, and a configured wedged shaped member 230 including wedge sides 232 and 234. Flexible link 224 connects the oval shaped body member 220 and the wedged shaped member 230 utilizing living hinges 226 and 228. The member of elements 218-234 including 208 and 209, which provides the living hinge attachment, is of a polyprolene homopolymer.

Figure 2:
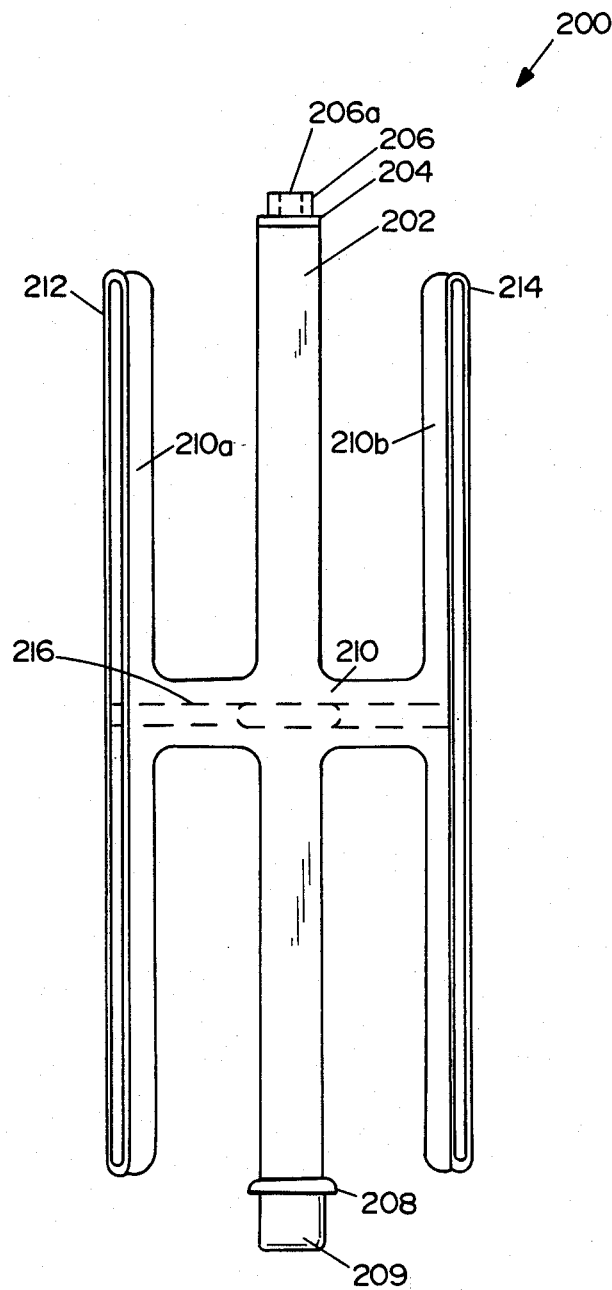
FIG. 2 illustrates a front view of the wafer retainer.

FIG. 2 illustrates a front view of the wafer retainer where all numerals correspond to those elements previously described.

Figure 3:
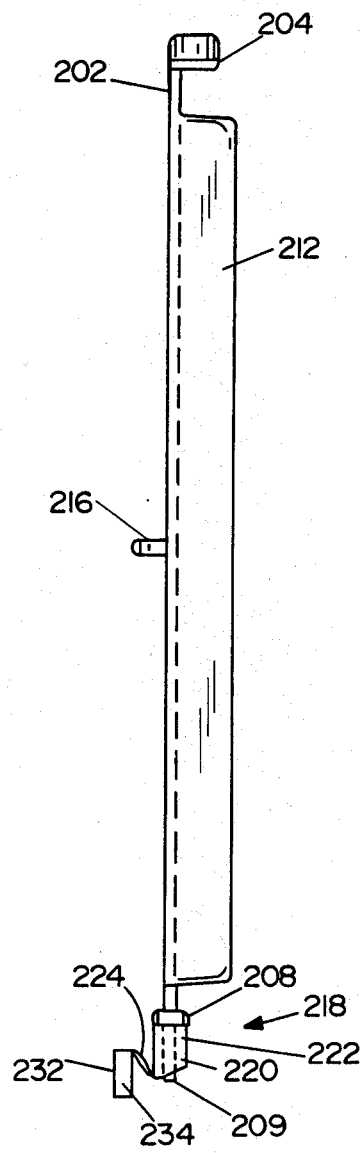
FIG. 3 illustrates a side view of the wafer retainer.

FIG. 3 illustrates a side view of the wafer retainer where all numerals correspond to those elements previously described.

Figure 4:
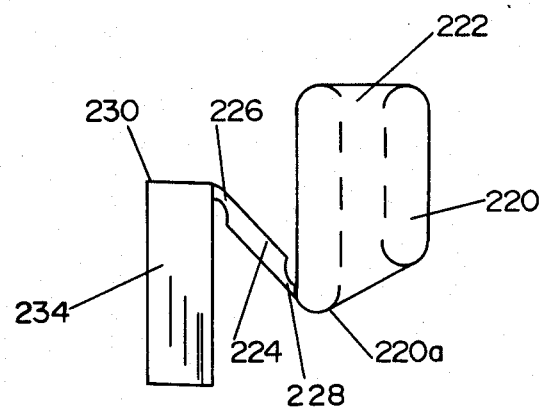
FIG. 4 illustrates a side view of a flexible coupler.

FIG. 4 illustrates a side view of the flexible coupler where all numerals correspond to those elements previously described.

Figure 5:
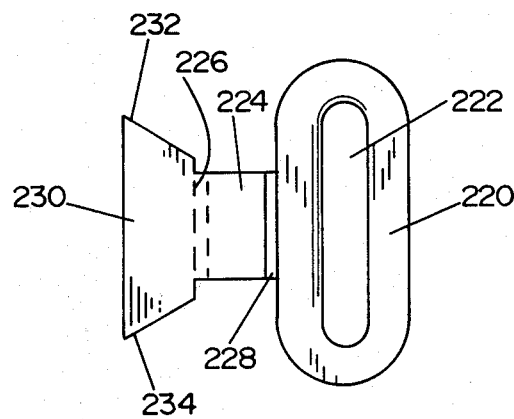
FIG. 5 illustrates a top view of the flexible coupler.

FIG. 5 illustrates a top view of the flexible coupler where all numerals correspond to those elements previously described.

FIG. 6 illustrates a front view of the box 12 where all numerals correspond to those elements previously described. The handles 48 and 50 and handle areas 44 and 46 are illustrated with respect to the outboard locking clip enclosures 52 and 54. A pin 235, shown in dashed lines, positions on the underside of top 28 and serves as a mounting pin 10 engaged with hole 206a of the wafer retainer 200.

FIG. 7 illustrates a bottom view of the box where all numerals correspond to those elements previously described. Particularly illustrated is the continuous inner perimeter support edge 70 for supporting the box door 14. Also illustrated are the latch pin openings 60 and 62 and the locking slots 56 and 58 as illustrated in dashed lines for conjunction with the locking clips 16 and 18. The pin 235 is illustrated positioning on the underside of the box surface 28.

Figure 8:
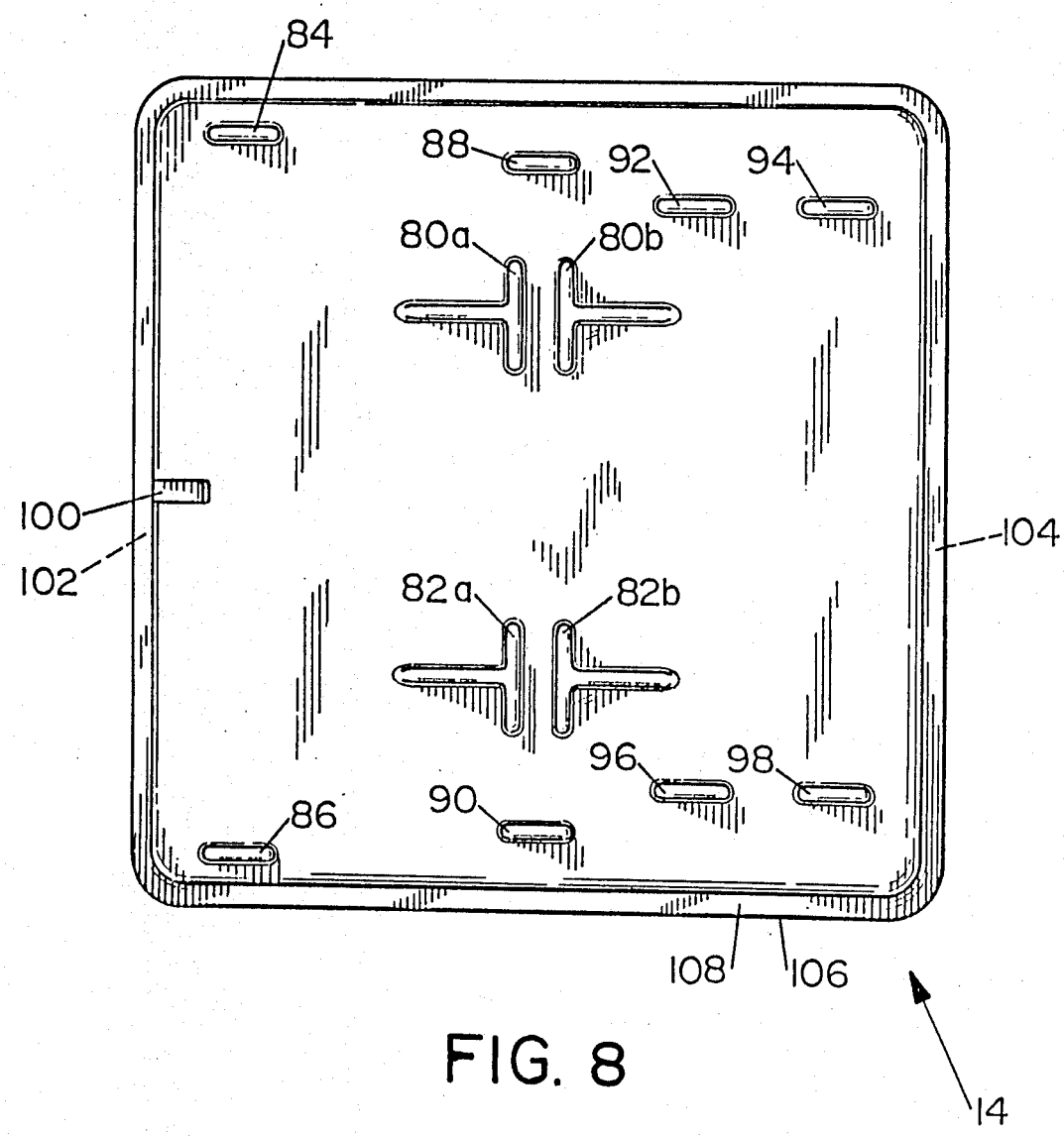
FIG. 8 illustrates a top view of the box door.

FIG. 8 illustrates a top view of the box door where all numerals correspond to those elements previously described. A cross bar engages in between members 80 and 82.

FIG. 9 illustrates a bottom view of the box door 14. The edge 106 is illustrated, as well as the under side of the lip 108. Registration pin holes 114, 116, and 118 are positioned for locating and registering of the box door 14, and extend downwardly from the bottom 112. Likewise, sensor trip pins 120 and 122 extend downwardly for tripping switches in the port plate of the SMIF equipment. Perimeter members 124, 126, 128 and 130 extend downwardly in a rectangular configuration for providing for stacking with the tabs 30-36 of the box 12. Members 124-146 also provide structural support and integrity for the door 14.

FIG. 10 illustrates a side view of the box 12, the wafer retainer 200 engaged in the storage box, the door 14, and the locking clips 16 and 18 where the components are separated prior to insert forming the SMIF storage box where all numerals correspond to those elements previously described. The locking clips 16 and 18 engage into the box 12 prior to the door 14 being positioned into the box, but the clips can be positioned into the outboard clip enclosures after the door 14 has been engaged into the box 12. The capturing cylinder 206 of the wafer retainer 200 engages over pin 235 on the underside of the box top 28 and the lower spring end 209 engages within oval shaped hole 222 in the flexible coupler body 220. Wedge shaped member 232 engages within and is captured within similarly shaped cavity 236 to anchor and affix the bottom portion of the wafer retainer 200 to side member 12 of box 12 as also illustrated in FIG. 13. The wafer retainer 200 positions and affixes adjacent to box side 22 as illustrated, and can be easily removed for replacement with a retaining spring of a different size for subsequent different applications, including differently sized wafer cassettes and/or wafers.

Figure 11:
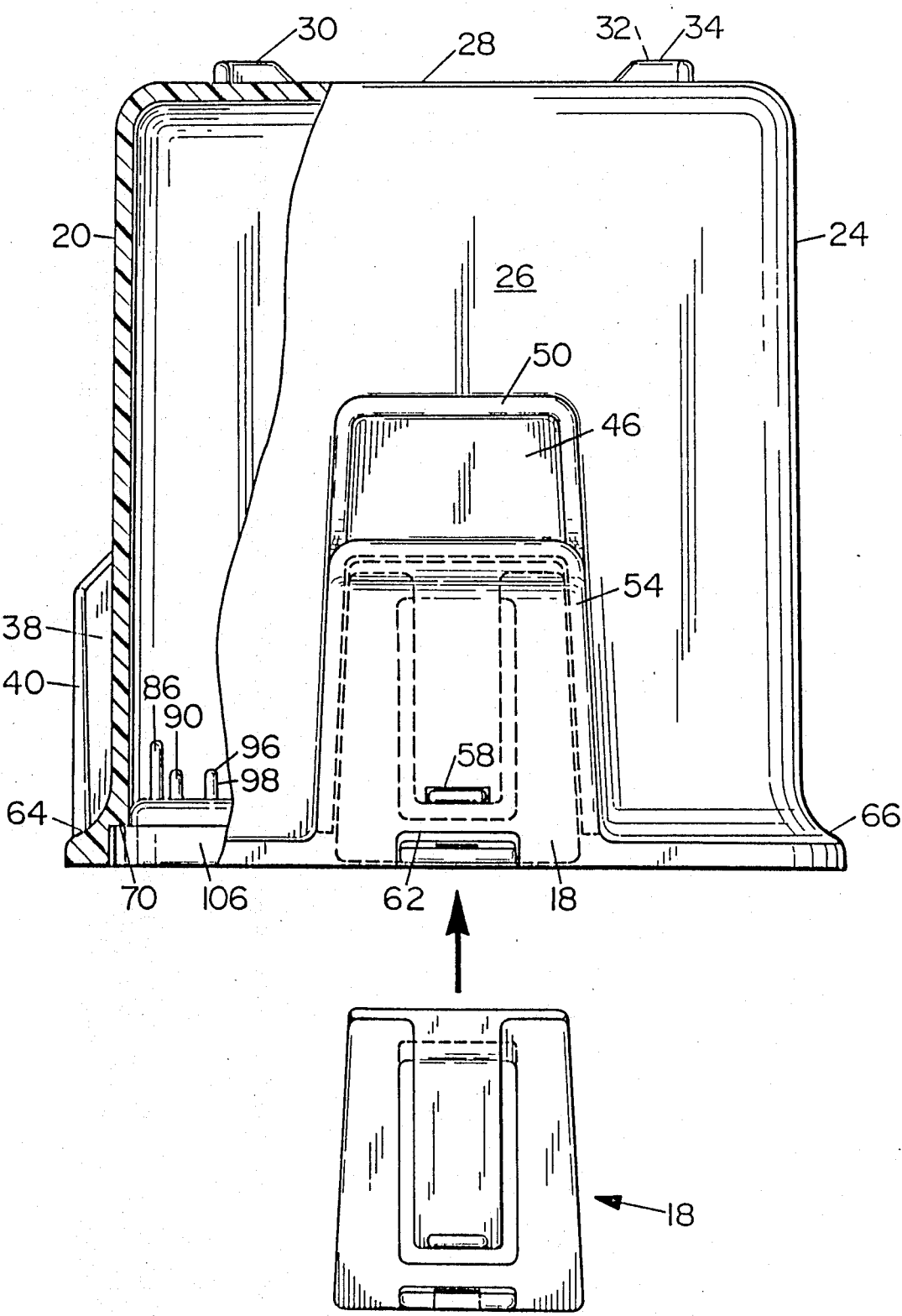
FIG. 11 illustrates a side elevation of the box door engaged within the storage box and a locking clip prior to and after insertion.

FIG. 11 illustrates a side view of the box 12 with the door 14 positioned therein, and a locking clip 18, which is identical to that of clip 16 prior to being engaged in the outboard clip enclosures, and then actually engaged within the clip enclosure. All numerals correspond to those elements previously described.

MODE OF OPERATION

FIG. 12 illustrates a cutaway partial section side view of the storage box 10 including the components of the box 12, the door 14, the locking clip 16 and 18 and the spring biased wafer retainer 200 all engaged and supporting a cassette and wafer therein with wafers. The outline of the cassette is shown, but for purposes of brevity and sake of illustration, the particular wash slots, as well as other structural detail of the wafer cassette, have not been shown in detail. The particular locking mechanisms of the locking clip, as illustrated two-fold with a lock retainer 150 engaged into the locking slot 56 and the spring latch 156 engaged into and about the lock interface detent 102. The clip members 130a and 130b provide spring for movement of the spring latch surface 156 away from the lock interface detent 102 about the spring point 148. As door 14 engages within box 12 the upper surface 232 of door 14 engages against the rounded end member 220a of end member 220, thus tensioning spring member 202 against pin 235 and the lower surface of top 12 causing the spring member 202 to bow inwardly and causing wafer contact bars 212 and 214 to come in contact with and apply pressure to discs 240a-240n, thus securing them within the wafer cassette. Movement of the oval shaped body member 220 and the lower end 209 of the spring member 202 is controlled by link 224 which restricts inboard lateral movement of the oval shaped body member 220. Configured wedge 230 is held and secured in conformingly shaped cavity 236 by the spring latch 156 when the door 14 is not engaged within the box 12, and by the continuous inner perimeter support edge 70 when the door 14 is engaged within box 12. The over-center cam device 216 provides for proper deflection of the spring member 202 inwardly towards the box center as the door 14 engages within box 12.

FIG. 13 illustrates a cutaway top view of the storage box including the wafer retainer 200 engaged against wafers in a wafer cassette where all numerals correspond to those elements previously described. Shown in particular is the positioning of the wafer contact bars 212 and 214 tensioned against the wafers 240a-240n at two points by action of the spring bar 202 in its actuated tensioned state. A cassette 250 is also shown engaged in the goof proof aligned position over and between cassette locators 80 and 82, flange locator pins 84 and 86.

Various modifications can be made to the present invention without departing from the apparent scope thereof.

What is claimed is:

1. Storage box for a wafer processing cassette comprising:
   a. box including four sides and a top, outboard robotic handle mend positioned on opposing sides, outboard spring clip retaining means positioned on opposing sides and adjacent said box opening a perimeter flange extending substantially about said four sides, and means for supporting a box door within said box;
   b. box door including a plurality of geometrically spaced upwardly extending means for locating said wafer processing cassette on end on an upper side of said door and two opposing detents on a lower side of said door;
   c. spring clip means including a locking retainer for engaging in said clip retaining means and a spring latch for engaging against said detents, said locking retainer means and said spring latch on opposing ends of geometrically configured member; and,
   d. wafer retainer means including a spring bar, a cross member positioned perpendicularly to said spring bar, opposed parallel vertically aligned contact bars positioned vertically and perpendicularly to the plane of said cross member, a link and wedge shaped member attached to said bottom of said spring bar whereby said spring biased wafer retainer positions against wafers in said processing cassette.

2. Wafer retainer of claim 1 wherein opposed parallel vertically aligned contact bars provide for tensioned two-point contact with said wafers for containment of said wafers in said cassette.

3. Wafer retainer of claim 1 wherein said lower bar end member movement is controlled by a link means.

4. Wafer retainer of claim 1 wherein said wafer retainer positions tensionally against said wafers by action and positioning of said door against said wafer retainer.

* * * * *